United States Patent [19]
Bertin et al.

[11] Patent Number: 6,030,855
[45] Date of Patent: Feb. 29, 2000

[54] SELF-ALIGNED CONNECTOR FOR STACKED CHIP MODULE

[75] Inventors: Claude L. Bertin, South Burlington; Thomas G. Ference, Essex Junction; Wayne J. Howell, Williston, all of Vt.

[73] Assignee: International Business Machines Corproation, Armonk, N.Y.

[21] Appl. No.: 09/246,435

[22] Filed: Feb. 8, 1999

Related U.S. Application Data

[62] Division of application No. 08/640,379, Apr. 30, 1996, Pat. No. 5,903,045.

[51] Int. Cl.$^7$ .......................... H01L 21/44; H01L 21/48; H01L 21/50; H01L 21/4763; H01L 29/40
[52] U.S. Cl. ...................... 438/109; 438/598; 438/622; 257/686
[58] Field of Search ................................ 438/109, 598, 438/611, 622, 678; 257/621, 686, 774, 737

[56] References Cited

U.S. PATENT DOCUMENTS

| | | | |
|---|---|---|---|
| 4,525,921 | 7/1985 | Carson et al. | 29/577 |
| 4,672,737 | 6/1987 | Carson et al. | 29/572 |
| 5,016,138 | 5/1991 | Woodman | 361/381 |
| 5,279,991 | 1/1994 | Minahan et al. | 437/208 |
| 5,426,566 | 6/1995 | Beilstein et al. | 361/735 |
| 5,432,729 | 7/1995 | Carson et al. | 365/63 |
| 5,466,634 | 11/1995 | Beilstein et al. | 437/180 |
| 5,478,781 | 12/1995 | Bertin et al. | 437/209 |
| 5,517,057 | 5/1996 | Beilstein et al. | . |
| 5,657,537 | 8/1997 | Saia | 29/830 |
| 5,688,721 | 11/1997 | Johnson | 438/109 |

*Primary Examiner*—Charles Bowers
*Assistant Examiner*—Nema Berezny
*Attorney, Agent, or Firm*—James M. Leas

[57] ABSTRACT

A semiconductor structure includes a stack of two semiconductor chips. An edge of the chips forms a side surface of the stack. Insulation and adhesive is located between the chips, and a wire contacting circuitry on one of the chips extends through the insulation to the side surface. A first conductor contacts the wire on the side surface. The first conductor is self-aligned to the wire and extends above the side surface. The first conductor facilitates pads or connectors on the side surface that are insulated from the semiconductor chips. The self-aligned first conductor is an electroplated or electroless plated metal.

11 Claims, 2 Drawing Sheets

SELF-ALIGNED CONNECTOR FOR STACKED CHIP MODULE

CROSS REFERENCE TO RELATED APPLICATION

This application is a divisional of application Ser. No. 08/640,379, Apr. 30, 1996, now U.S. Pat. No. 5,903,045.

FIELD OF THE INVENTION

This invention generally relates to a semiconductor module formed of stacked semiconductor chips. More particularly, it relates to self-aligned contacts on the side surface of a stack of semiconductor chips.

BACKGROUND OF THE INVENTION

The use of multiple layers of chips provides the opportunity to form very dense electronic circuitry with a very high rate of communication between chips in the stack. The key problem has been to provide wiring to interconnect the chips and for external contact.

In one well known chip stacking structure, transfer wires embedded in insulation on the planar surface of each chip of the stack extend between chip circuits and one edge of the chip, these chip edges forming a side surface of the stack. Stacks of adhesively bonded together chips have these chip edges aligned. Large T-connect pads for interconnection and external connection are located on that side surface contacting ends of those transfer wires.

Because the chips may vary significantly in thickness and alignment, and because the adhesive and insulation between chips may vary in thickness, the position of a transfer wire end on the side surface is uncertain. The uncertainty has made quite difficult the traditional photolithographic semiconductor processing method of using a mask to open contact through an insulator to all desired locations on the side surface at once.

One proposed solution, described in U.S. Pat. No. 4,525, 921, to Carsen et al. (the '921 Patent), was to selectively etch the silicon on the side surface, thereby leaving tips of transfer wires extending beyond the etched silicon surface. A side surface insulator, such as polyimide, was then deposited and polished back to expose the tips of transfer wiring for electrical contact. Now, metal could be deposited and T-connect pads photolithographically formed without risk of shorting to conductive edges of the silicon chips since the conductive silicon surface was covered by the side surface insulator. A problem with the solution of the '921 Patent was that the silicon-polyimide interface was seriously eroded by the silicon etch, leaving a gap therebetween creating significant downstream processing problems. In addition, the process exposed for contact, not just the desired transfer wire but all metal layers that happened to be along the chip edge, including lower level kerf metal layers. The T-connect pads next deposited tended to short all these metal layers together.

An alternative proposed solution used photolithographic processing with an individual exposure to form a channel via on the edge of each chip of the stack. Significant attention was needed in opening this via to avoid exposing lower levels of metal and bare silicon edges of the chips during the steps to expose and contact the transfer wires. The spacing and alignment variations necessitated (1) the addition of thicker insulation, (2) the use of extra masking steps on the chip planar surface, and (3) extra photoexposure and masking steps on the side surface of the stack to avoid opening contact to kerf metal and conductive chip edges. In addition, the use of thicker insulation between chips added significantly to mechanical problems in providing for external contact because polymeric insulation, such as polyimide, has a thermal expansion coefficient much greater than that of silicon.

Thus, a better solution is needed that provides a lower cost and more reliable method of forming contact pads at the ends of each transfer wire on the side surface of the stack, the contacts well insulated from the silicon substrates and kerf metal, and this solution is provided by the following invention.

SUMMARY OF THE INVENTION

It is therefore an object of the present invention to provide a self-aligned contact to the end of each transfer wire.

It is another object of the present invention to provide a self-aligned transfer wiring extension contacting the end of each transfer wire.

It is a feature of the present invention that self-alignment is achieved by plating.

It is a feature of the present invention that transfer wiring extends to two edges of each chip to facilitate low resistance contact to all transfer wires on the chip during electroplating.

It is an advantage of the present invention that electroplating provides extensions on ends of transfer wires while substantially avoiding extensions on exposed kerf metal on the side surface of the stack.

It is an advantage of the present invention that transfer wiring extensions have a larger cross sectional area than transfer wires, providing a larger target area of contact for later photolithographically defined wiring on the side surface of the stack.

These and other objects, features, and advantages of the invention are accomplished by a semiconductor structure comprising a planar surface comprising a semiconductor and a first insulator. The structure further comprises a metal lead extending no higher than said surface, the lead insulated from the semiconductor by the first insulator. The structure further comprises a non-integral first conductor contacting the lead, the first conductor extending above the surface, the first conductor self-aligned to the lead.

In one aspect of the invention, the planar surface is a first side surface of at least two stacked integrated circuit chips, the side surface comprising semiconductor edges of the stacked chips, and the first insulation is insulation between the chips. The conductive lead makes electrical contact with a circuit on one of the chips, and the conductive lead extends through the first insulation to the first side surface.

In another aspect of the invention, lead extensions are added to exposed ends of transfer wiring on the side surface of a stack by a self-aligned method such as plating. Then insulation, such as polyimide, is deposited and polished back to expose the lead extensions. The insulation permits T-connect pads to now be formed, by a method such as photolithography, without concern for shorting to silicon substrates.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention provides an extension of the transfer wiring above the side surface of a stack of semiconductor chips. The extension permits the formation of T-connect pads that are electrically isolated from the silicon chips and in reliable contact with the transfer metal of each chip of the stack.

Prepositions, such as "on" and "higher" are defined with respect to a semiconductor surface, regardless of the orientation the structure is actually held. That surface may be the conventional planar surface of a semiconductor chip or wafer or it may be a planar side surface of a stack of semiconductor chips. A planar side surface of a stack of semiconductor chips includes semiconductor edges of the chips, insulation, and adhesive therebetween. A layer is on another layer even if there are intervening layers.

Figure 1:
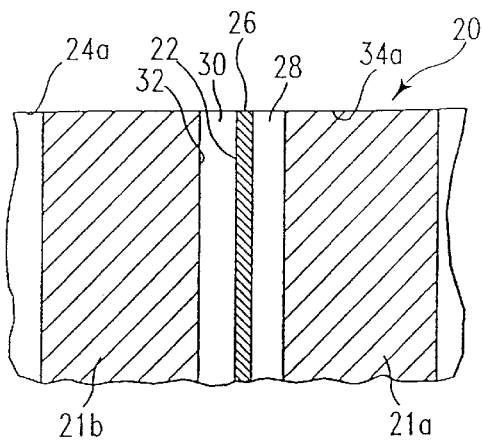
FIGS. 1–2 are cross sectional views of steps in the process of fabricating self-aligned lead extensions on the side surface of a stack of integrated circuit chips.

FIGS. 1–6 show steps in the process of fabricating the plated stud extension, insulating layer, and T-connect pad. FIG. 1 shows a cross section of stack 20, including chips 21a and 21b. The cross section is taken through transfer metal wire 22 after first side surface 24a of stack 20 has been polished to a planar surface exposing end 26 of transfer metal wire 22. Insulating layers 28 and 30, formed during wafer processing, isolate transfer metal wire 22 from lower levels of metal on chip 21a and from back surface 32 of adjacent chip 21b. Insulating layers 28 and 30 together have a thickness of about 25 um, and more preferably less than 15 um to reduce thermal expansion effects.

Figure 1A:
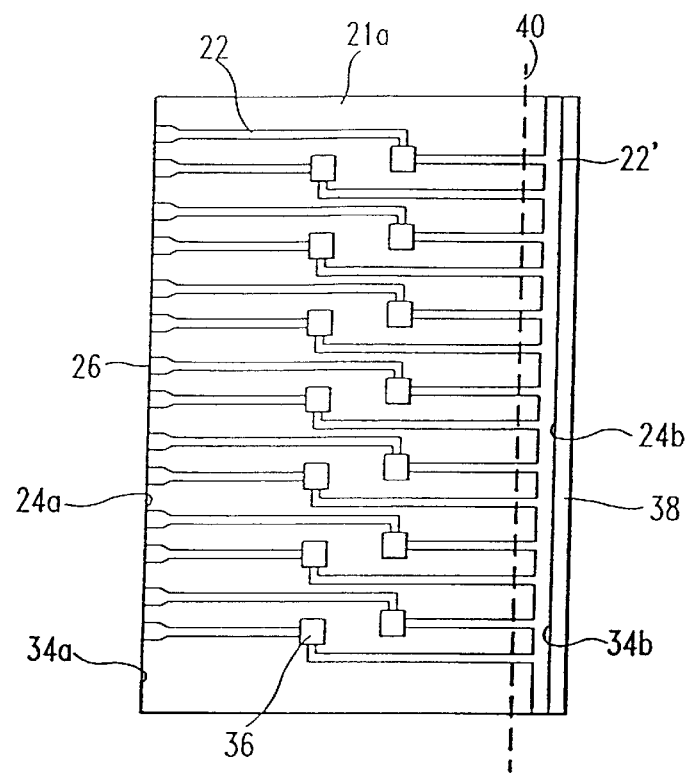
FIG. 1a is a top view of the top surface of a chip in a stack of chips showing transfer wires extending to two edges of the chip.

Transfer metal wire 22 connects circuits on chip 21a to front edge 34a of chip 21a, as shown in the top view of top chip 21a of stack 20 in FIG. 1a. Transfer metal wire 22 may be one of the standard wiring levels of a chip. However, transfer metal wire 22 is commonly an extra level of metal that connects standard external contact pad 36 of chip 21a to edge 34a. Transfer metal wire 22 is formed of a metallic conductor, such as aluminum. Transfer metal wire 22 can also be a metal such as copper, chrome, nickel, or gold. Insulating layers 28 and 30, through which transfer metal wire 22 extends, are formed from an insulator such as polyimide, silicon dioxide, or silicon nitride. Insulating layer 30 includes a top layer of adhesive for gluing chips 21a and 21b together. Transfer metal wire 22 and insulating layers 28 and 30 are all formed during wafer processing.

Figure 2:
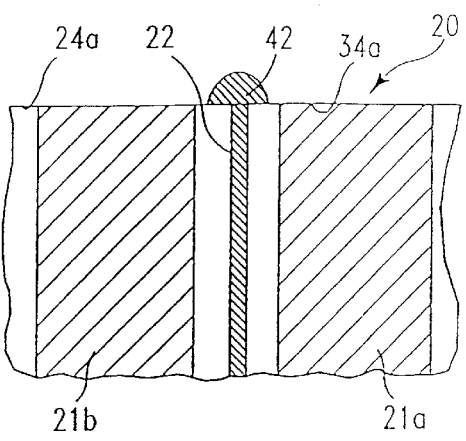

In the next step, shown in FIG. 2, extension 42 is plated on exposed end 26 of transfer metal wire 22. Extension 42 is a metal such as copper, chrome, nickel, or gold, and can be formed by a process, such as plating, that deposits metal only on a reactive surface, such as where metal is already present, to provide self-alignment of extension 42 with transfer metal wire 22.

While processes for both electroplating and electroless plating metals to aluminum are well known in art, the present structure poses two difficulties. First, for electroplating, it is necessary to contact and provide approximately equal electrical current at each transfer wire of each chip of the stack. Second, in addition to exposed end 26 of transfer metal wire 22, side surface 24a of stack 20 also includes exposed polished edges 34a of semiconductor chips 21a, 21b which may be reactive for plating deposition. For both electroplating and electroless plating, it is necessary to avoid plating that shorts transfer wire 22 to silicon edges 34a. It is also desirable to avoid plating that shorts transfer wire 22 to kerf metal exposed along silicon edges 34a. (Of course, it is also possible to avoid shorting to kerf metal by following the kerf-clear process of EP701284, published on Mar. 13, 1996, but this involves additional processing steps and cost at wafer level).

To facilitate electrical contact for electroplating in the next step, each transfer metal wire 22 extends both to front edge 34a and to back edge 34b of each chip 21, as shown in the top view of top chip 21b of stack 20 in FIG. 1a. Additionally, all transfer wires 22 extending to back edge 34b are joined together by interconnecting transfer metal wire 22' that extends along back edge 34b of each chip 21b to facilitate equal contact to each transfer wire 22 of the chip during the electroplating step. Transfer wires 22 and 22' are formed in a single deposition step during wafer processing. Furthermore, to further facilitate electrical contact to all transfer wires 22 of all chips 21 of stack 20, after chip stacking steps are complete, blanket layer of metal 38 is deposited on second side surface 24b of stack 20, contacting interconnecting transfer wire 22' on back edge 34b of each chip in stack 20. The redundant connection to transfer wires 22 through both interconnecting transfer wire 22 and blanket metal 38 provides a larger area of contact and assures roughly equal contact resistance to all transfer wires on all chips so as to obtain roughly equal electroplating thickness in the next step. After electroplating is complete, back surface 24b of stack 20 is polished to level 40, removing blanket metal 38 and interconnecting transfer wire 22' on back edges 34b of all chips of stack 20.

Figure 5:
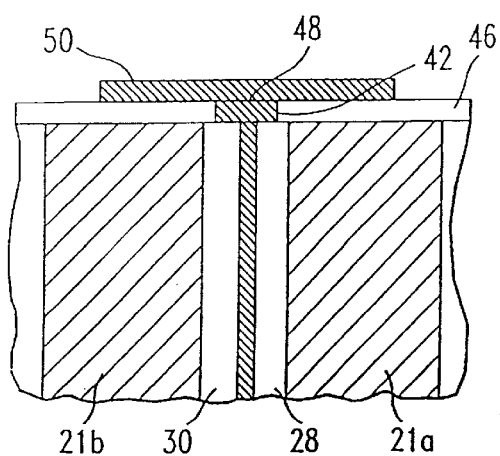
FIG 5 is a cross sectional view of a T-connect pad contacting a self-aligned lead extension and insulated from silicon edges on the side surface of a stack of integrated circuit chips.

As to the shorting problems, for the electroplated embodiment, because the several levels of metal used for test structures in the kerf area between chips on a wafer are electrically isolated from chip transfer metal wire 22 no metal will electroplate and no extension will form on exposed kerf metal, automatically eliminating kerf metal as a concern for shorting when T-connect pads are later formed (FIG. 5). However, if blanket layer of metal 38 contacts back silicon surface 24b and kerf metal also contacts the silicon an extension may electroplate on kerf metal. But this kerf extension will be much thinner than that plating on transfer metal wire 22 because the higher conductivity of the transfer wire.

Similarly, because the conductivity of the semiconductor is significantly lower than transfer metal wire 22, metal will electroplate much more thickly on end 26 of transfer metal wire 22 than on semiconductor edge 34a. The thin layer of metal can be left in place on silicon edges 34a. Alternatively, the thin layer of metal can be removed by a dip etch after the electroplating process is complete. While removing the thin layer of plated metal on silicon edges 34a, the dip etch removes only a comparable thin layer of extension 42.

It is also possible to entirely prevent plating on the semiconductor edges by passivating silicon edges 34a before electroplating or electroless plating. Edges 34a can be passivated by a method such as providing a coating on silicon edges 34a, while leaving ends 26 of transfer wires 22 exposed for plating. Such a coating can be provided by standard deposition and photolithographic steps.

In preparation for plating, end 26 of aluminum transfer wire 22 may be cleaned and oxide removed with a chromic phosphoric etch.

Figure 3:
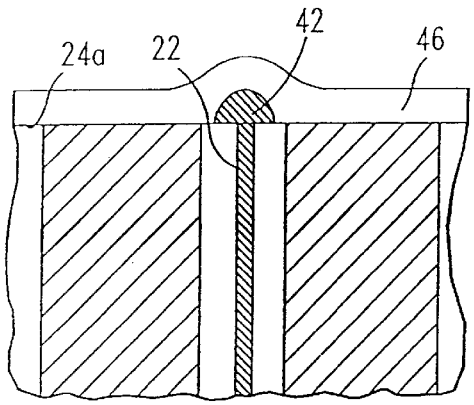
FIGS. 3–4 are cross sectional views of steps in the process of opening contact to self-aligned lead extensions insulated from silicon edges on the side surface of a stack of integrated circuit chips.
Figure 4:
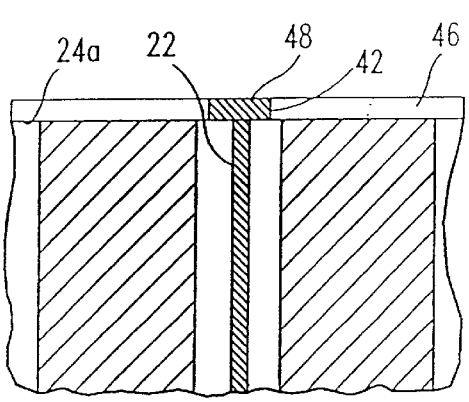

After the plating step, thin polyimide layer 46 is then applied to side surface 24 of stack 20 as shown in FIG. 3. Polyimide layer 46 is then polished back, by a method such as chemical-mechanical polishing, exposing top 48 of extension 42 as shown in FIG. 4. Metal T-connect pad 50 can is then formed in contact with top 48 of extension 42, as shown in a cross sectional view in FIG. 5 and in a top X-ray view in FIG. 6. Metal T-connect pads 50 is formed by a process such as deposition of a layer of photoresist which is exposed to open a window centered on top 48 of extension 42. A metal, such as aluminum, is then deposited by a process such as evaporation. Photoresist is then stripped, lifting off unwanted metal, leaving T-connect pad 50.

Figure 6:
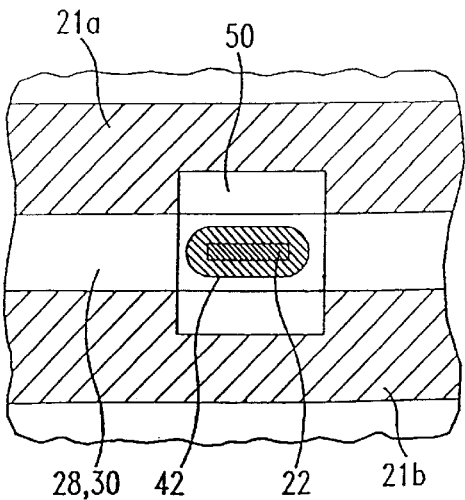
FIG. 6 is a top view of the side surface of a stack of chips showing the T-connect pad of FIG. 5 and an X ray view showing the transfer wire and the lead extension contacting the T-connect pad.

While FIGS. 5–6 show a single transfer metal wire 22, self-aligned extension 42, and T-connect pad 50, side surface 24a of stack 20 actually has a large array of transfer metal wires 22, extensions 42, and T-connect pads 50. Because T-connect pads are large, typically having a dimension of 100 um square, individual exposure steps for each chip of the stack are not needed at this step; a single exposure step for the entire stack is adequate to assure contact to all tops 48 of extensions 42 on stack 20. Thus, the present invention eliminates the alignment and thickness variation difficulties associated with contacting the array of transfer metal wires extending to side surface 24a.

Figures 5A, 7:
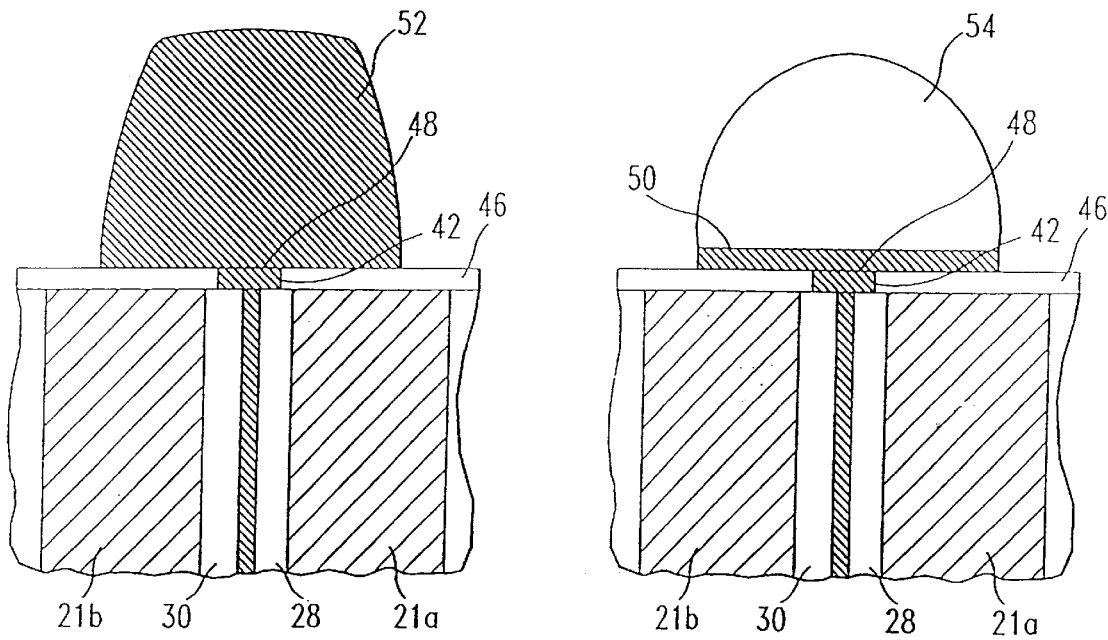
FIG. 5a is a cross sectional view of a process step in fabricating the structure of FIG. 5 in which a T-connect pad is formed self-aligned to the lead extension.
FIG. 7 is a cross sectional view of terminal metal, including a solder bump after reflow, on the T-connect pad of FIG. 5.

Alternatively, T-connect pad 50 is formed self-aligned to extension 42 by additional metal plating after the step illustrated in FIG. 4, as shown in FIG. 5a. About 100 um of metal 52 is plated in this step, the plating extending in both vertical and horizontal directions from top 48 of extension 42. A polishing step is then implemented to form T-connect pad 50, having a thickness of about 2 um and lateral dimensions of about 100 um, as shown in FIGS. 5 and 6. Plated metal 52 and T-connect pad 50 are formed of a metal, such as chrome, nickel, copper, or gold.

Finally, a terminal metal, or layers of terminal metals, is deposited. The deposition is formed by a process such as evaporation through a mask. The same mask may be used as was used to provide T connect pad 50 of FIG. 5. Alternatively, the terminal metals may be deposited by a process such as plating. The terminal metals may include metals such as chrome, copper, gold, nickel, and solder. Solder may then be reflowed to provide solder bump 54, as shown in FIG. 7.

The present invention has several distinct advantages over the prior art. First, extension 42 facilitates electrical isolation of T-connect pad 50 from edge 34a of silicon chip 21b. This isolation is accomplished by polyimide layer 46 having a thickness provided by the fact that extension 42 extends from side surface 24a. An opening in polyimide layer 46 for contact to transfer wire 22 is self-aligned to extension 42, avoiding the need for a series of difficult photomasking steps. In this regard, the present invention is equivalent to the silicon etch-back process of the '921 Patent. Second, the present invention avoids the damage to the silicon-polyimide interface inherent in silicon etch-back process of the '921 Patent. Third, at least for the electroplating embodiment, the present invention avoids the possibility of shorting to kerf metal inherent in the process of the '921 Patent. In the present invention an electroplated extension is formed on end 26 transfer of wire 22 but there is virtually no electroplating on exposed kerf metal since kerf metal is not electrically connected to transfer wires. Fourth, extension 42 has a larger surface area for contact with T-connect pad 50 than would transfer wire 22 alone, thereby increasing the reliability of the T-connect compared with the process of the '921 Patent. Fifth, for the embodiment in which extension 42, T-connect pad 50, terminal metals and solder bump 54 are all plated, each metal is centered on the preceding metal and the whole structure is perfectly aligned with transfer wire 22.

While several embodiments of the invention, together with modifications thereof, have been described in detail herein and illustrated in the accompanying drawings, it will be evident that various further modifications are possible without departing from the scope of the invention. For example, a wide range of semiconductor materials, such as silicon, germanium, and gallium arsenide can be used for chips of the stack. Similarly, a wide range of platable metals can be used. Nothing in the above specification is intended to limit the invention more narrowly than the appended claims. The examples given are intended only to be illustrative rather than exclusive.

What is claimed is:

1. A method for fabricating a semiconductor structure, comprising the steps of:
   a) providing a planar surface comprising a semiconductor and a first insulator;
   b) forming a metal lead extending no higher than said surface, said lead insulated from said semiconductor by said first insulator; and
   c) forming a non-integral first conductor contacting said lead and extending above said surface, said first conductor self-aligned to said lead.

2. A method as recited in claim 1, wherein
   said planar surface providing step (a) comprising the step of polishing a first side surface of at least two stacked integrated circuit chips, said side surface comprising semiconductor edges of said stacked chips and said first insulator, said first insulator being a first layer of insulation extending between said chips; and
   said conductive lead forming step (b) comprising the steps of making electrical contact with a circuit on one of said chips and providing said conductive lead through said first layer of insulation to said first side surface.

3. A method as recited in claim 2, said forming step (c) being a plating step.

4. A method as recited in claim 2, further comprising the step of providing a second layer of insulation, said second layer of insulation being on said first side surface, said method further comprising the step of depositing a metallization layer on said second layer of insulation, said metallization layer electrically contacting said first conductor.

5. A method as recited in claim 4, wherein said metallization layer depositing step comprises the step of forming a T-connect pad.

6. A method as recited in claim 5, wherein said metallization layer depositing step comprises the step of plating.

7. A method as recited in claim 6, further comprising the step of polishing said plated metal to form said T-connect pad.

8. A method as recited in claim 4, further comprising the step of forming a terminal metal on said metallization layer.

9. A method as recited in claim 8, said terminal metal forming, step comprising the step of plating solder.

10. A method as recited in claim 2, said stacked chips further comprising a second side surface, said method further comprising the step of providing said conductive lead to said second side surface and to said first side surface.

11. A method as recited in claim 10, said method further comprising the step of providing a plurality of said conductive leads to said second side surface and to said first side surface, said plurality of conductive leads all interconnected along said second side surface.

* * * * *